(12) United States Patent
Enquist

(10) Patent No.: US 6,867,073 B1
(45) Date of Patent: Mar. 15, 2005

(54) SINGLE MASK VIA METHOD AND DEVICE

(75) Inventor: Paul M. Enquist, Cary, NC (US)

(73) Assignee: Ziptronix, Inc., Morrisville, NC (US)

( * ) Notice: Subject to any disclaimer, the term of this patent is extended or adjusted under 35 U.S.C. 154(b) by 0 days.

(21) Appl. No.: 10/688,910

(22) Filed: Oct. 21, 2003

(51) Int. Cl.[7] .............................................. H01L 21/44
(52) U.S. Cl. ...................... 438/125; 438/106; 438/455; 438/456; 438/459; 438/618; 438/620; 438/637; 438/666
(58) Field of Search ................................ 438/125, 106, 438/455, 456, 459, 618, 620, 637, 666

(56) References Cited

U.S. PATENT DOCUMENTS

| | | | |
|---|---|---|---|
| 6,218,203 B1 * | 4/2001 | Khoury et al. ................ | 438/15 |
| 6,515,343 B1 * | 2/2003 | Shroff et al. ................. | 257/530 |
| 6,656,826 B2 * | 12/2003 | Ishimaru ...................... | 438/612 |
| 6,720,212 B2 * | 4/2004 | Robl et al. ................... | 438/132 |
| 2002/0094661 A1 * | 7/2002 | Enquist et al. ............... | 438/455 |
| 2003/0109083 A1 * | 6/2003 | Ahmad ......................... | 438/125 |
| 2003/0129796 A1 * | 7/2003 | Bruchhaus et al. .......... | 438/239 |

\* cited by examiner

Primary Examiner—Matthew Smith
Assistant Examiner—Victor V Yevsikov
(74) Attorney, Agent, or Firm—Oblon, Spivak, McClelland, Maier & Neustadt, P.C.

(57) ABSTRACT

A method of connecting elements such as semiconductor devices and a device having connected elements such as semiconductor devices. A first element having a first contact structure is bonded to a second element having a second contact structure. A single mask is used to form a via in the first element to expose the first contact and the second contact. The first contact structure is used as a mask to expose the second contact structure. A contact member is formed in contact with the first and second contact structures. The first contact structure may have an aperture or gap through which the first and second contact structures are connected. A back surface of the first contact structure may be exposed by the etching.

48 Claims, 11 Drawing Sheets

SINGLE MASK VIA METHOD AND DEVICE

CROSS-REFERENCE TO RELATED APPLICATIONS

This application is related to applications Ser. Nos. 09/532,886, now U.S. Pat. No. 6,500,794 and 10/011,432, the entire contents of which are incorporated herein by reference.

BACKGROUND OF THE INVENTION

1. Field of the Invention

The present invention relates to the field of three-dimensional integrated circuits and more particularly to the fabrication of three-dimensional integrated circuits using direct wafer bonding.

2. Description of the Related Art

Semiconductor integrated circuits (ICs) are typically fabricated into and on the surface of a silicon wafer resulting in an IC area that must increase as the size of the IC increases. Continual improvement in reducing the size of transistors in ICs, commonly referred to as Moore's Law, has allowed a substantial increase in the number of transistors in a given IC area. However, in spite of this increased transistor density, a continual demand in increased IC complexity and functionality has resulted in a continued increase in IC chip area. This increase in chip area results in a reduction in chip yield and, correspondingly, increased chip cost.

Another trend in IC fabrication has been to increase the number of different types of circuits within a single IC, more commonly referred to as a System-on a-Chip (SoC). This fabrication typically requires an increase in the number of mask levels to make the different types of circuits and an increase in IC area to accommodate the increased number of types of circuits. This increase in mask levels and IC area also result in a reduction in yield, and correspondingly, increased chip cost.

An approach to avoiding this undesired decrease in yield and increase in cost is to vertically stack and subsequently interconnect ICs. These ICs can be of different size, come from different size wafers, comprise different functions (i.e., analog, digital, optical), be made of different materials (i.e., silicon, GaAs, InP, etc.). The ICs can be tested before stacking to allow Known Good Die (KGD) to be combined to improve yield. The success of this stack first, interconnect second approach depends on the yield and cost of the stacking and interconnection being favorable compared to the yield and cost associated with the increased IC area or SoC. A generic method for realizing this approach is to stack ICs using direct bonding and to interconnect ICs using conventional wafer thinning, photolithography masking, via etching, and interconnect metallization.

The cost of the interconnect portion of this approach is directly related to the number of photolithography masking levels required to etch vias and form electrical interconnects. It is thus desirable to minimize the number of photolithography masking levels required to etch vias and form electrical interconnects.

One version of vertical stacking and interconnection is where ICs (on a substrate) are bonded face-to-face, or IC-side to IC-side. This version is typically done in a die-to-wafer format where die are bonded IC-side down, to a wafer IC-side up. In this format, after bonding, the die are typically substantially thinned by removing most of the die substrate. The die substrate can not, in general, be totally removed due to the location of transistors in the substrate. The substrate is thus typically removed to the greatest extent practicable, leaving sufficient residual substrate to avoid damage to the transistors. An interconnection to the die IC is then preferably made by etching a via through the remaining substrate to an interconnection location in the die IC, such that there are no necessary transistors in the vicinity of this via. It is furthermore preferable, in order to achieve the highest interconnection density, to continue this via through the entire die-IC and into the wafer-IC to an interconnection location in the wafer IC. This via typically extends through an insulating dielectric material that provides desired electrical isolation from interconnection locations in the die IC and wafer IC. After the formation of this via, it is typically necessary to interconnect the interconnection location in the die-IC with the interconnection location in the wafer-IC. This is preferably done with a conductive material on an insulating layer between the conductive material and the exposed substrate on the via sidewall to avoid undesired electrical conduction between the conductive material and the substrate.

The fabrication of this structure typically takes four photolithography masking levels to build. These levels are 1) via etch through substrate, 2) via etch through insulating dielectric material in the die IC and wafer IC that exposes desired conductive material in the die IC and wafer IC, 3) via etch through the insulating layer that electrically isolates the conductive material that interconnects the interconnect location in the die IC with the interconnect location in the wafer IC to the exposed substrate via sidewall that exposes desired conductive material in the die IC and wafer IC, 4) interconnection with conductive material between exposed interconnection point in the die IC with exposed interconnection point in the wafer IC.

The patterns defining the via etching through the insulating (dielectric) material(s) are typically smaller than the pattern defining the via etch through the substrate to adequately expose the interconnection points in the die IC and wafer IC and to avoid removing insulating material on the substrate via sidewall. Since these patterns are formed after the via in the substrate, this patterning is typically done at a lower topographical level that the patterning of the substrate via. This results in a patterning over a non-planar structure that limits the scaling of the structure to very small feature size that is desirable to achieve the highest interconnection density and consumes the least possible silicon substrate where functional transistors would otherwise reside.

It is thus desirable to have a device that comprises a structure and a method to fabricate the structure requiring a reduced number of masking steps and masking steps that can be realized on a planar surface, at the highest, or one of the highest, levels of topography in the structure.

SUMMARY OF THE INVENTION

The present invention is directed to a method and device where a single masking step is used to etch a via or vias through a substrate in a first device to expose contacts in first and second devices to provide for interconnection of the contacts.

As one example, a single masking step can be used to etch a via through a remaining portion of a substrate, etch a via through insulating material exposing conductive material in two separate and vertically stacked IC devices, cover desired exposed remaining substrate portion surfaces with a desired insulating material, and expose conductive material in two separate IC devices by removing desired insulating material from said conductive material without removing desired insulating material from said desired exposed remaining substrate surfaces.

The present invention is further directed to a method and device comprising interconnection between interconnection points in the two separate IC devices where a masking step is not done at a lower topographical level than the single masking step.

It is an object of the present invention to etch a via through different materials, exposing conductive material on at least two different topographical levels lower than a top surface using a single masking step.

It is a further object of the present invention to mask an interconnect level, interconnecting two subcutaneous conductive layers, at a level above the two subcutaneous conductive layers.

It is another object of the present invention to avoid patterning a mask in a recess.

Another object of the present invention is to maximize the interconnect density between two stacked ICs.

Another object of the present invention is to minimize the amount of substrate used to form an interconnection between two stacked ICs.

These and other objects are achieved by a device having a first element having a first contact structure and a second element having a second contact structure. The first element is bonded the second element. A first via is formed in the first element and extends from a back surface of the first element to the first contact structure. A second via extends from the first contact structure to the second contact structure and communicates with the first via. A contact member connects the first and second contact structures.

These and other objects are also achieved by a method of interconnecting first and second elements bonded together, including forming one mask over an exposed side of said first element, using the one mask to etch the first element and expose a first contact structure in the first element, etch through a bond interface between the first and second elements, and expose a second contact structure in the second element, and connecting the first and second contact structures.

BRIEF DESCRIPTION OF THE DRAWINGS

A more complete appreciation of the present invention and many attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1:
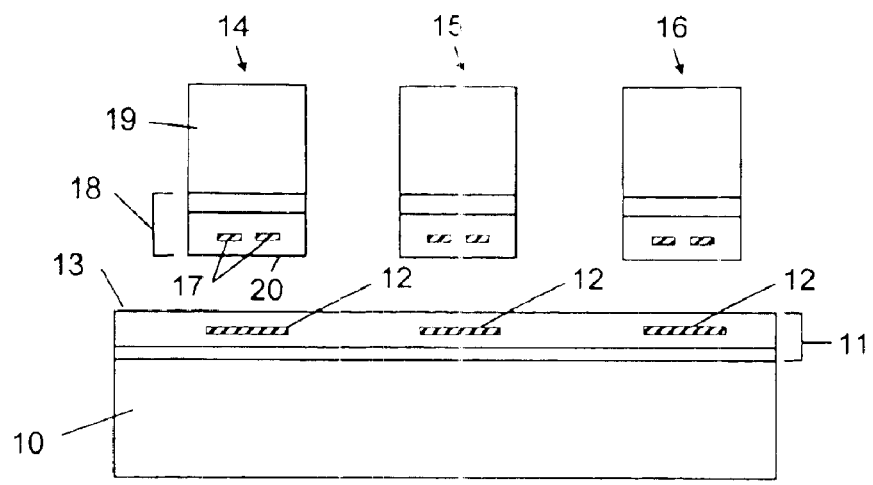
FIG. 1 is a diagram showing die to be bonded face-down to a wafer face-up.

Referring now to the drawings, in particular FIG. 1, a first embodiment of the method according to the invention will be described. It is noted here that the drawings are not drawn to scale but are drawn to illustrate the concepts of the invention.

Substrate 10 includes a device region 11 having contact structures 12. Substrate 10 may be made of a number of materials, such as semiconductor material or insulating material, depending on the desired application. Typically, substrate 10 is made of silicon or III–V materials. Contact structures 12 are typically metal pads or interconnect structures making contact to device or circuit structures (not shown) formed in substrate 10. Substrate 10 may also contain an integrated circuit to which the contact structures 12 are connected, and substrate 10 may be a module containing only contact structures. For example, substrate 10 may be a module for interconnecting structures bonded to substrate 10, or bringing out connections for packaging or integration with other modules or circuit structures on, for example, a printed circuit board. The module may be made of insulative materials such as quartz or ceramic.

Positioned for bonding to substrate 10 on surface 13 are three separated die 14–16. Each die has a substrate portion 19, a device region 18 and contact structures 17. The die may be previously separated from another wafer by dicing, etc. Die 14–16 may be made of a number of materials, such as semiconductor materials, depending on the desired application. Typically, the substrate is made of silicon or III–V materials. Contact structures 17 are typically metal pads or interconnect structures making contact to device or circuit structures formed in device region 18. The sizes of pads 12 and 17 each may vary. The sizes and relative sizes are dependent upon alignment tolerances, circuit design parameters or other factors. The sizes of the pads are drawn to illustrate the inventive concepts are and are not meant to be limiting. Device region 18 may also contain an integrated circuit to which the contact structures 17 are connected. Substantially all of substrate portion 19 may be removed, leaving a layer of devices, a circuit, or a circuit layer. Also, the substrates of dies 14–16 may be thinned after bonding to a desired thickness.

Die 14–16 may be of the same technology as wafer 10, or of different technology. Die 14–16 may each be the same or different devices or materials. Each of die 14–16 has conductive structures 17 formed in a device region 18. Structures 17 are spaced apart to leave a gap therebetween, or may be a single structure with an aperture which may extend across the entire contact structure. In other words, the aperture may be a hole in contact structure or may divide the contact structure in two. The size of the gap or aperture may be determined by the photolithographic ground rules for the particular technology being bonded, i.e., at least a minimum width for the subsequent contact connecting structures 12 and 17 to be reliably formed with sufficiently low contact resistance.

An additional factor that determines the optimum size of the gap or aperture is a ratio of a distance given by the vertical separation between conductive structures 17 and 12 plus the thickness of the conductive structure 17 to the size of the gap or aperture. This defines an aspect ratio of a via that will subsequently be formed between conductive structures 17 and 12 to enable electrical interconnection between structures 17 and 12. This vertical separation is typically 1–5 microns for oxide to oxide direct bonding, as described in application Ser. No. 09/505,283, the contents of which are incorporated herein by reference, or potentially zero for metal direct bonding, as described in application Ser. No. 10/359,608, the contents of which are herein incorporated by reference. Furthermore, the conductive structure 17 thickness is typically 0.5 to 5 microns. With a typical desired via aspect ratio of 0.5 to 5 depending on the process technology used, a typical range of the size of the gap is 0.3–20 microns for oxide to oxide bonding or ~0.1–10 microns for metal direct bonding.

Dies 14–16 are generally aligned with the contact structures 12 such that structures 17 and the gap or aperture are positioned over corresponding contact structures 12. The size of contact structures 12 is chosen to allow die 14–16 to be simply aligned with the gap between structures 17. This size depends on the alignment accuracy of the method used to place die 14–16 on substrate 10. Typical methods using commercially available production tools allow alignment accuracies in the range of 1–10 microns, although future improvements in these tools is likely to result in smaller alignment accuracies. The lateral extent of structures 17 exterior to the gap or aperture is preferably at least a distance given by this alignment accuracy.

Although only one set of structures 17 is shown for each die 14–16, it is understood that the lateral extent of structures 17 is typically much smaller than the lateral extent of each die 14–16, so that each die may have several or a very large number of structures 17. For example, structures 17 may have a lateral extent in the range of 1–100 microns and die 14–16 may have a lateral extent in the range of 1–100 mm. A quantity of structures 17 in die 14–16 having an order of magnitude $10^4$ and much higher is thus practically realizable.

Figure 2A:
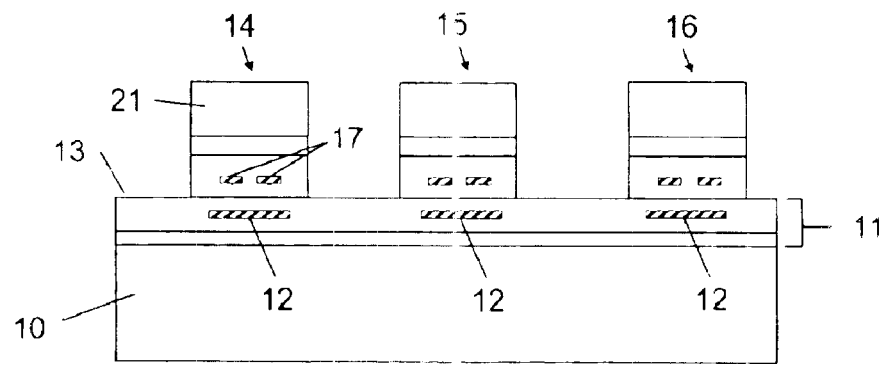
FIG. 2A is a diagram of die bonded to a substrate.
Figure 2B:
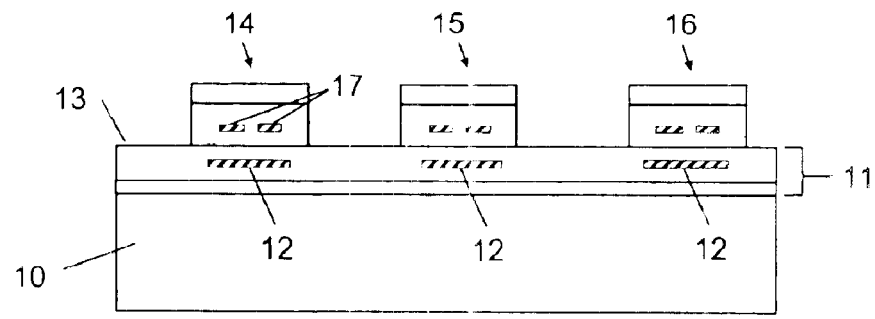
FIG. 2B is a diagram of die bonded to a substrate with a portion of the substrate of the die removed.

As shown in FIG. 2A, surface 20 of die 14 is bonded to surface 13 of substrate 10. This may be accomplished by a number of methods, but is preferably bonded at room temperature using a bonding method as described in application Ser. No. 09/505,283. The bonding of die 14–16 to substrate 10 is illustrated in FIG. 2. After bonding the substrates of die 14–16 are thinned. Thinning is typically achieved by polishing, grinding, etching, or a combination of these three techniques to leave thinned substrate 21 or to completely remove substrate portion 19. FIG. 2B illustrates the example where substrate portion 19 is completely or substantially completely removed. Also, the substrates of dies 14–16 may be thinned prior to bonding.

Figure 2C:
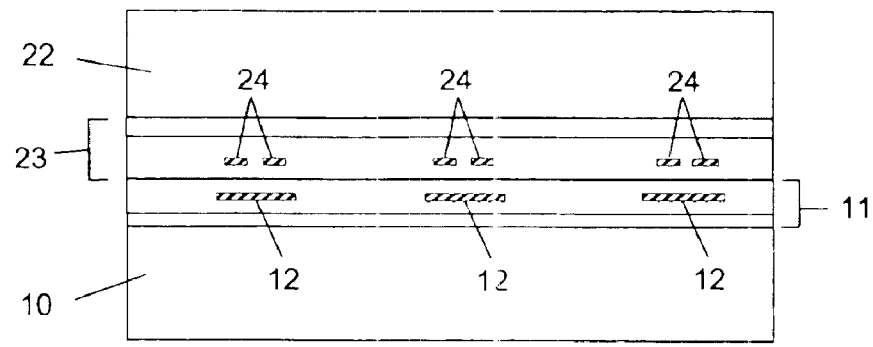
FIG. 2C is a diagram of a substrate bonded to another substrate.

While three die are shown bonded to a single substrate 10 in FIG. 2A, it is also possible to bond a larger or smaller number of die to substrate 10. Also, it is possible to bond another substrate of a size comparable to that of substrate 10, which is illustrated in FIG. 2C where a substrate 22 having a device region 23 is bonded to wafer 10 such that spaced apart conductive structures 24 are generally aligned with conductive structures 12. Substrate 22 may be thinned or removed prior to bonding to facilitate alignment. Substrate 22 may be thinned after bonding, and substantially all of substrate 22 may be removed if desired. The procedures described in the following figures are also applicable to the structures shown in FIGS. 2B and 2C, but separate drawings are omitted for brevity.

Figure 3A:
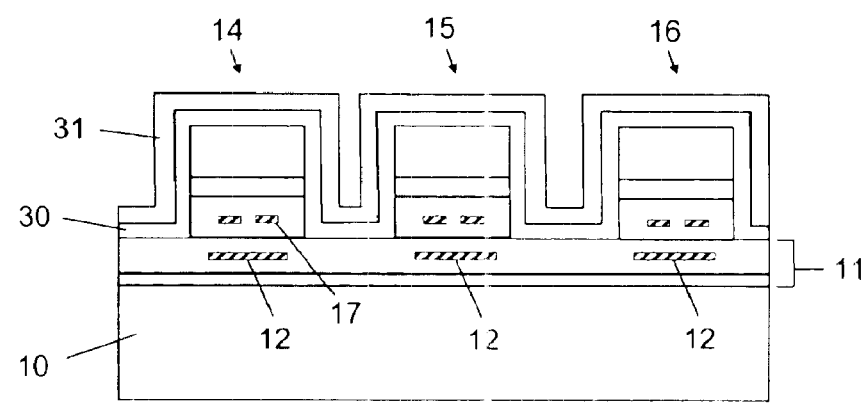
FIG. 3A is a diagram showing formation of a dielectric film and mask layer over the structure of FIG. 2A.
Figure 3B:
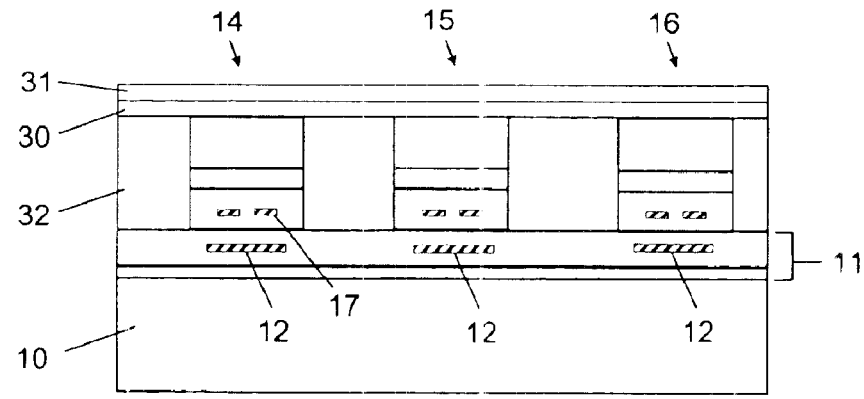
FIG. 3B is a diagram showing formation a dielectric film and mask layer after forming a planarizing material.

As shown in FIG. 3A, a conformal dielectric film 30 is formed over surface 13 of substrate 10 and dies 14–16. This film may be formed by, for example, CVD, PVD or PECVD and preferably consists of an oxide film such as silicon oxide. Also, a filler material such as a deposited or spun-on oxide or polymer 32 such as polyimide or benzocyclobutene may be formed over and/or between dies 14–16, as shown in FIG. 3B. Material 32 may be formed at various points in the process. FIG. 3B shows the example where material 32 is formed prior to forming films 30 and 31. Filler, material may also be formed after forming the structure shown in FIGS. 3A, after forming mask 40 (FIG. 4), or at various other points in the process depending on many factors such as the materials chosen or temperature considerations. Having a flat surface may improve forming photoresist and other films on the surface and forming apertures in such films, for example, aperture 41 shown in FIG. 4.

Figure 4:
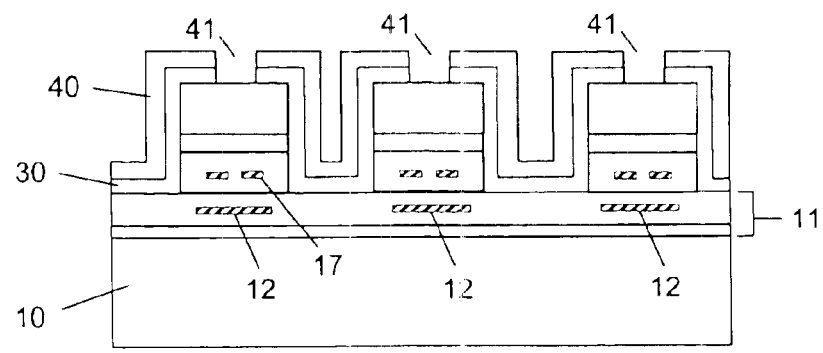
FIG. 4 is a diagram showing apertures formed in the dielectric film and mask layer of FIGS. 3A and 3B.

Subsequently, a hard mask 31 is formed on dielectric film 30 and patterned to leave apertures 41 generally aligned with structures 17 (FIG. 4). The hard mask is preferably comprised of a material that has a high etch selectivity to a subsequent etch process or processes used to etch a via through thinned substrate 21 and device regions 18 and 11 to contact structures 12. Examples of a hard mask are aluminum, tungsten, platinum, nickel, and molybdenum, and an example of an etch process is an SF6-based reactive ion etch to etch a via through a thinned silicon substrate and a CF4-based reactive ion etch to etch a subsequent via through device regions 18 and 11 to contact structures 12.

Aperture 41 is formed using standard photolithographic patterning and etching techniques of the hard mask 31 and dielectric film 30. For example, an aperture can be formed in photoresist using photolithography. This aperture can be aligned to alignment marks on the die 14–16 (or substrate 22), or substrate 10. Optical or IR imaging can be used for the alignment. The hard mask 31 can then be etched with an appropriate wet chemical solution or a dry reactive ion etch that depends on the hard mask material, revealing the dielectric film 30 in the aperture. The dielectric film 30 can then be etched in a manner similar to the hard mask 31 with an appropriate wet chemical solution or a dry reactive ion etch that depends on the dielectric film material. An example of a wet chemical solution for a hard mask is Aluminum Etchant Type A if the hard mask is Aluminum. An example of a reactive ion etch for a dielectric film material is a CF4-based reactive ion etch if the dielectric film material is silicon oxide. Many other wet and dry etches are possible for these and other hard mask and dielectric film materials. The width of the apertures 41 is preferably wider than the spacing between the structures 17 if the aperture is aligned to the die 14–16 (or substrate 22), or, preferably wider than the spacing between the structures 17 plus the alignment accuracy of the method used to place die 14–16 (or substrate 22), on substrate 20 if the aperture is aligned to the lower substrate 20.

Figure 5:
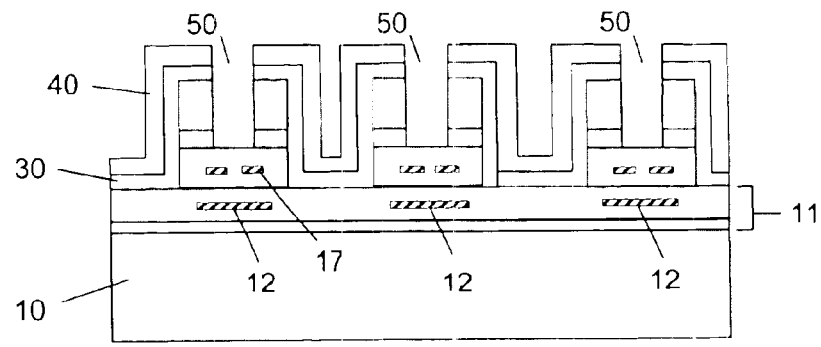
FIG. 5 is a diagram showing etching of the die using the aperture formed as shown in FIG. 4.
Figure 6A:
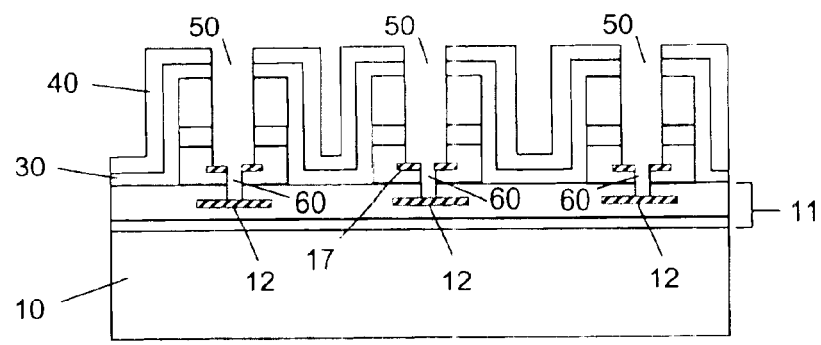
FIG. 6A is a diagram showing further etching to expose contact structures in the die and wafer.

Using the hard mask 40, substrate portions of dies 14–16 are etched to form vias 50, as shown in FIG. 5. The etching is continued through the material surrounding conductive structures 12 and 17, which typically is a dielectric material, to expose back and side portions of conductive structure 17 and a top surface of conductive structures 12. A first set of gases and conditions, for example SF6-based, may be used to etch through the substrate material of dies 14–16, and a second set of gases and conditions, for example CF4-based, may be used to etch through the dielectric layers surrounding the contact structures 17. Both etches may be performed in one chamber by switching gases and conditions appropriately, without having to break vacuum. The etching to expose conductive structure 12 is shown in FIG. 6A. The etching produces a via portion 60 extending through the gap or aperture of conductive structures 17 to conductive structure 12.

The dielectric via etching to expose conductive structures 12 and 17 preferably has a high etch selectivity to conductive structures 17 so as to avoid a detrimental amount of etching to conductive structures 17. However, there may be some combinations of dielectric via etching and conductive structures that result in a detrimental amount of etching to conductive structures 17. For example, detrimental effects may occur when conductive structure 17 is sufficiently thin or when the vertical distance between conductors 12 and 17 is sufficiently large.

An example of a detrimental amount of etching is some combinations of aluminum conductive structures 17 surrounded by silicon oxide dielectric and some CF4-based reactive ion etches where the ratio of the aluminum conductive structure etch rate to the silicon oxide dielectric etch rate is comparable to or higher than the ratio of the thickness of conductive structure 17 to the thickness of silicon oxide dielectic between conductive structures 12 and 17.

Figure 6B:
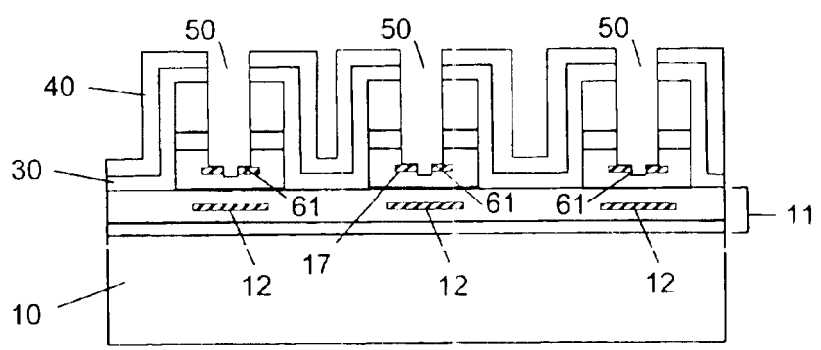
FIG. 6B is a diagram of a process modification including forming a hard mask.

In those situations where there would be a detrimental amount of etching to contact structures 17, the thickness of conductive structures 17 may be increased or an intermediate step is added to protect conductive structures 17 from the dielectric via etch. An intermediate process step can be used to avoid detrimental etching as follows. When the dialectic etching first exposes back and side portions of upper conductive structure 17, a hard mask, such as a metal material, can be selectively deposited on revealed portions of conductive structure 17 before continuation of the dielectric etching results in detrimental etching to conductive structure 17. After selective deposition of a hard mask, the dielectric etching can be continued without detrimental etching to conductive structure 17. An example of a selective deposition of a hard mask is electroless nickel plating. This is shown, for example, in FIG. 6B where etching is stopped after exposing contact structures 17 and before any significant detrimental etching occurs. Contact structures 17 are then coated with a protective hard mask material 61, for example, nickel using, for example, electroless plating. A material such as nickel may remain in the device in subsequent connecting of the structures 12 and 17. Alternatively, the material 61 may be removed before forming connecting structures 12 and 17, if needed.

Figure 7A:
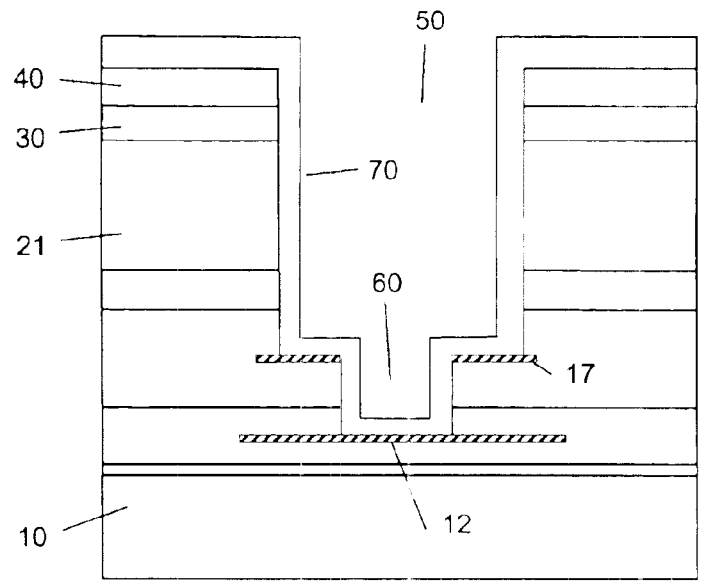
FIG. 7A is a diagram of a section of the structure of FIG. 6A after formation of a conformal insulative sidewall layer.

Note that protective hard mask 61 may also be selectively deposited on hard mask 40. An example is when hard mask 40 is conductive and deposition of protective hard mask 61 is accomplished with electroless plating This may be advantageous for decreasing the required thickness of hard mask 40. A further advantage of deposition of protective hard mask material 61 on hard mask 40 may be a restriction of the aperture of via 50 resulting in shadowing of a portion of contact structures 17 from anisotropic etching of via 60. FIG. 7A illustrates one of the elements 14–16 in detail to more clearly illustrate the subsequent steps. A conformal insulative film 70 is formed over mask 40 and conductive structures 12 and 17, and the sidewall of vias 50 and 60, partially filling vias 50 and 60. Examples of a suitable insulative film are silicon oxide, silicon nitride or Parylene. The insulative film may be formed using a number of typical deposition methods including but not limited to physical vapor deposition, chemical vapor deposition, and vapor phase deposition. An example of physical vapor deposition is sputtering, an example of chemical vapor deposition is plasma enhanced chemical vapor deposition, and an example of vapor phase deposition is vaporization of a solid, followed by pyrolysis and then deposition.

Figure 7B:
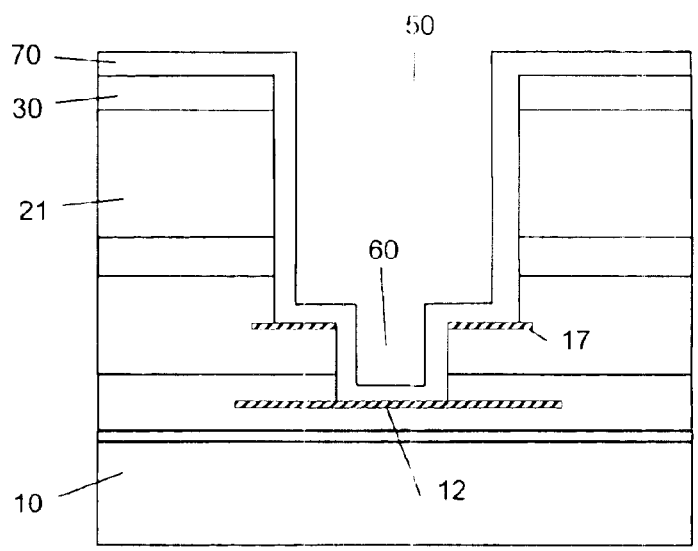
FIG. 7B is a variation of the embodiment where the hard mask is removed.

Mask 40 or mask 40 and dielectric film 30 may be removed before formation of conformal insulative film 70 by, for example, etching. FIG. 7B illustrates the case where mask 40 is removed. If the etch to remove mask 40 or mask 40 and film 30 is selective to materials exposed by vias 50 and 60, this etch can be done without a mask. If this etch is not selective to materials exposed by vias 50 and 60, those materials subject to etch in vias 50 and 60 may be masked with a suitable material. For example, if the hard mask 40, and contact structures 12 and 17 are all aluminum, the vias can be partially filled with an easily removable spin-on viscous liquid material to a depth such that contact structures 12 and 17 are covered. The vias can be partially filled with a spin-on viscous liquid material by first selecting an adequate spin-on film thickness that will suitably planarize the surface formed by hard mask 40 through which vias 50 and 60 were formed. Application of this film thickness will then result in a much thicker film thickness inside the via than outside the via. A suitable etch of the entire surface then removes this material from the surface of hard mask 40 while leaving material in vias 50 and 60 that covers contact structures 12 and 17. An example of an easily removable spin-on material and suitable etch are photoresist and an 02 plasma etch, respectively.

Figure 8A:
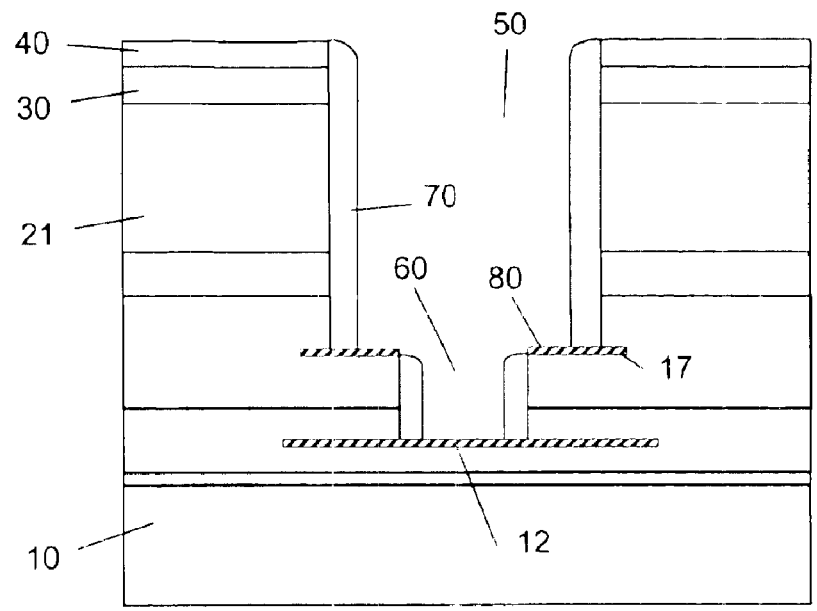
FIG. 8A is a diagram showing anisotropic etching of a conformal insulative sidewall layer.
Figure 8B:
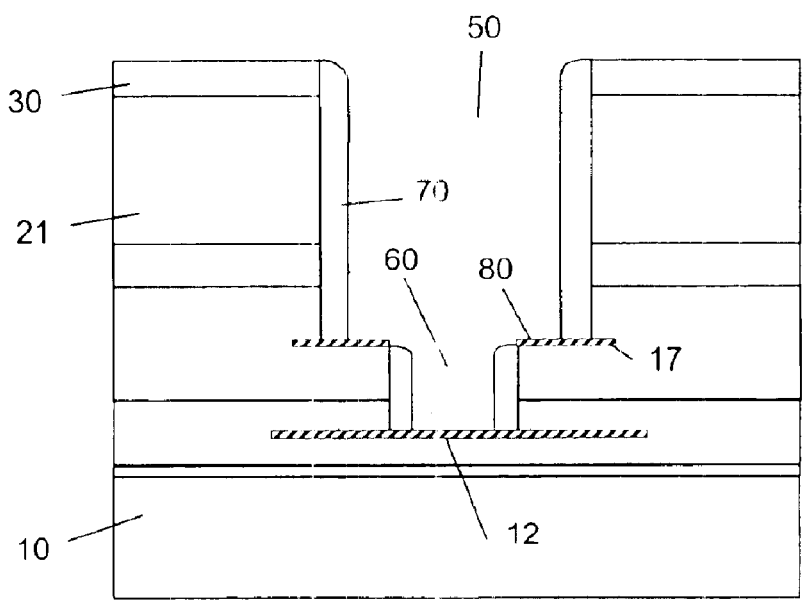
FIG. 8B is a variation of the embodiment where the hard mask is removed.

Conformal film 70 is an anisotropically etched to expose structures 12 and 17 while leaving film 70 on the sidewalls of vias 50 and 60. A back surface of structures 17 is preferably exposed to create a ledge for increasing the contact surface area, resulting in reduced contact resistance. A typical ledge width in excess of 1 micron is preferred for minimizing the contact resistance, but this distance will vary based upon device and process parameters. FIGS. 8A and 8B depict the etched conformal film 70, without and with mask 40 removed before formation of conformal insulative film 70, respectively.

Both of films 30 and 40 may be removed prior to forming layer 70. In this case, following etching of conformal layer 70 another insulating layer may be formed on substrate portion 21 (or device region 18 where portion 21 is completely removed) by oxidation or deposition, for example.

A side surface of contact structures 17 may also be exposed in the anisotropic etching to further increase the surface area and lower the contact resistance. This is also shown in FIGS. 8A and 8B. The vias 50 and 60 can then be further filled or completely filled with metal. Methods of filling vias 50 and 60 with metal include but are not limited to physical vapor deposition (PVD), chemical vapor deposition (CVD) or electroplating. Electroplating is typically used for the deposition of thicker films than PVD or CVD and is typically preceded by the deposition of a thin PVD or CVD seed layer. An example of PVD is sputtered aluminum or copper, an example of CVD is tungsten CVD, and an example of electroplating is copper, using a sputtered copper seed layer.

Figure 9A:
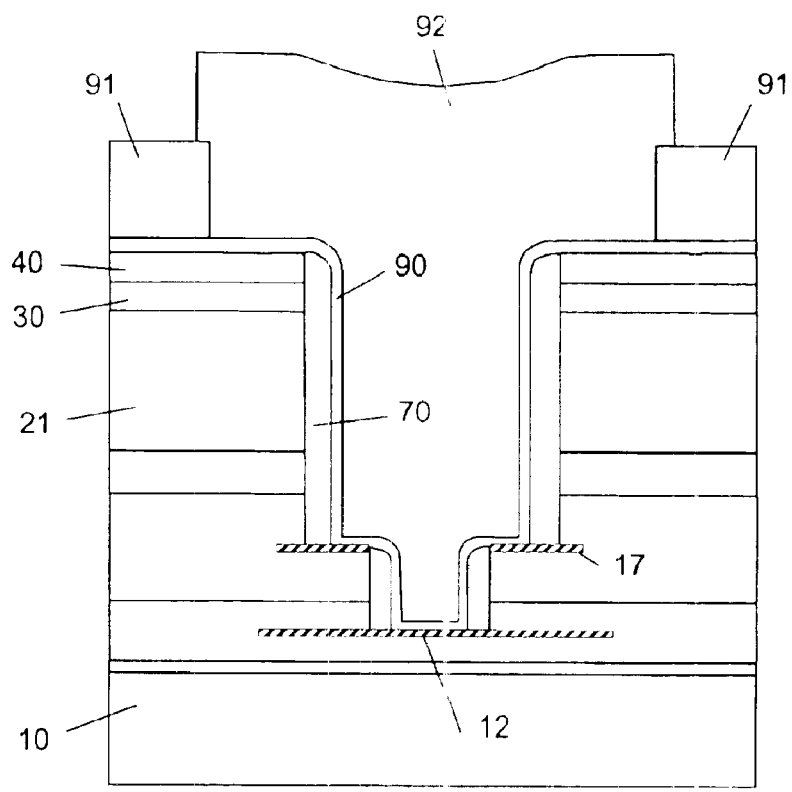
FIG. 9A is a diagram showing forming a metal contact comprising a metal seed layer and a metal fill.
Figure 9B:
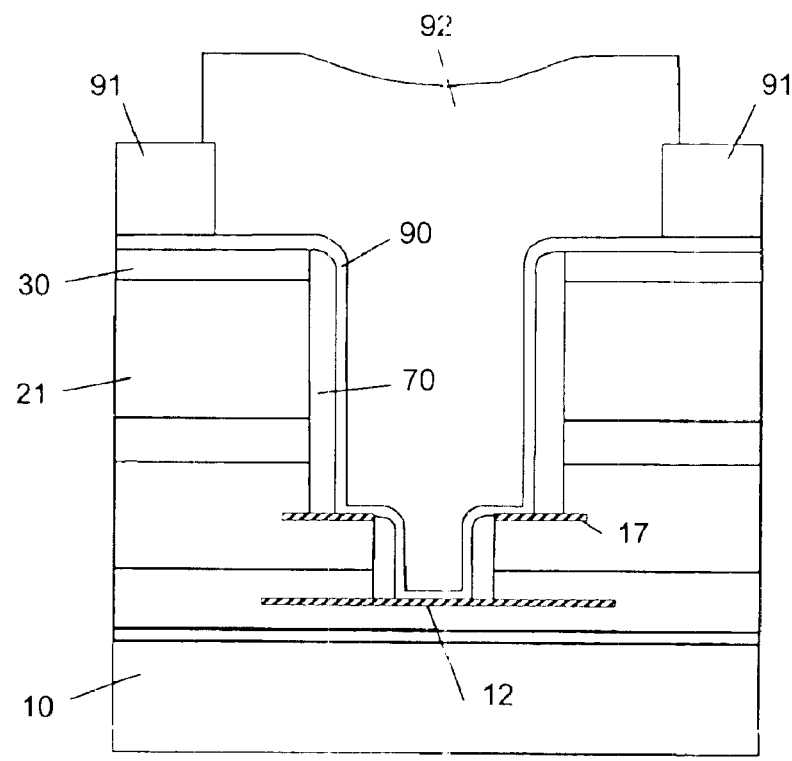
FIG. 9B is a variation of the embodiment where the hard mask is removed.
Figure 9C:
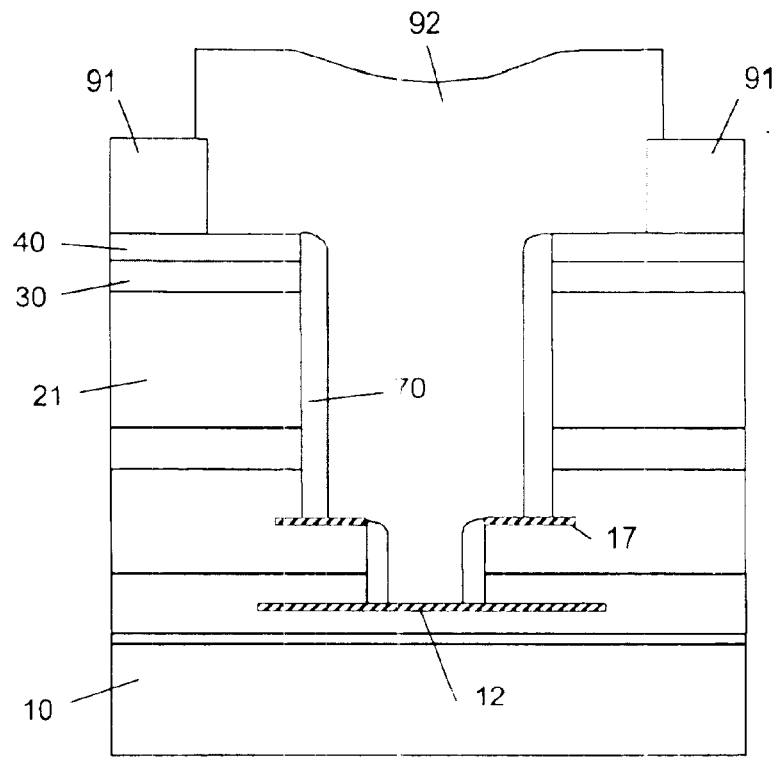
FIG. 9C is a variation of the embodiment where no seed layer is formed.
Figure 10A:
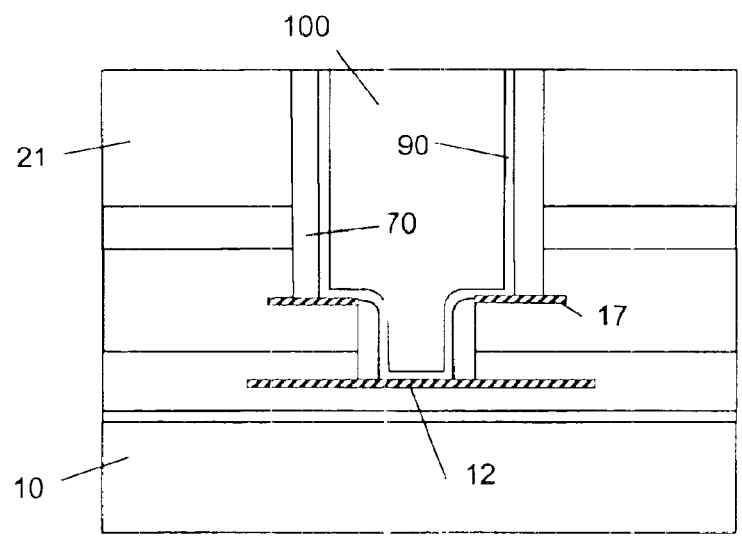
FIG. 10A is a diagram of the structure of FIG. 9A or 9B after chemo-mechanical polishing.
Figure 10B:
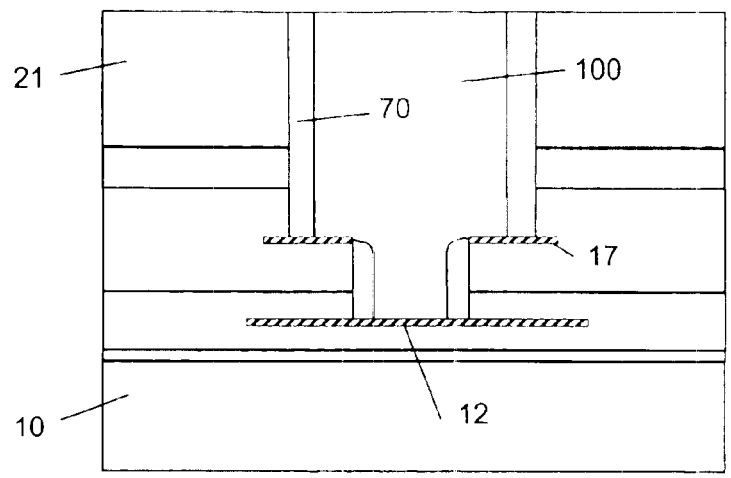
FIG. 10B is a diagram of the structure of FIG. 9C after chemo-mechanical polishing.

FIG. 9A shows an example of a masked electroplated method whereby a metal seed layer 90 is first deposited over the structure, making electrical contact to contact structures 12 and 17, followed by formation of a mask using, for example, photoresist 91. Using mask 91 and electrical contact to seed layer 90, metal contact 92 fills vias 50 and 60. In FIG. 9B, a structure is shown where mask 40 is removed before formation of conformal insulative film 70, and FIG. 9C shows the structure where no seed layer is used. A polishing step, for example chemo-mechanical polishing, can then be used to remove the excess portion of metal contact 92 outside of vias 50 and 60. This polishing step can also remove the metal seed layer 90 on the exposed side of die 14–16. It further can remove the hard mask 40 on the exposed side of die 14–16. The removal of hard mask 40 may be preferred if hard mask is electrically conductive as in the case of aluminum given above, in order to electrically isolate so formed metal filled vias from each other. This polishing step may further remove conformal dielectric film 30, resulting in a substantially planar surface and planar metal structure 100 on the exposed side of die 14–16, as shown in FIGS. 10A and 10B, where the structure in FIG. 10B is distinct from that in FIG. 10A in that no seed layer is used prior to filling the via with metal. The structures of FIGS. 10A and 10B are suitable for subsequent processing including but not limited to photolithography-based interconnect routing or underbump metallization to support wirebonding or flip-chip packaging. This processing typically includes the formation of an electrically insulating material on the exposed side of die 14–16 to provide electrical isolation for the interconnect routing or underbump metallization.

Figure 11:
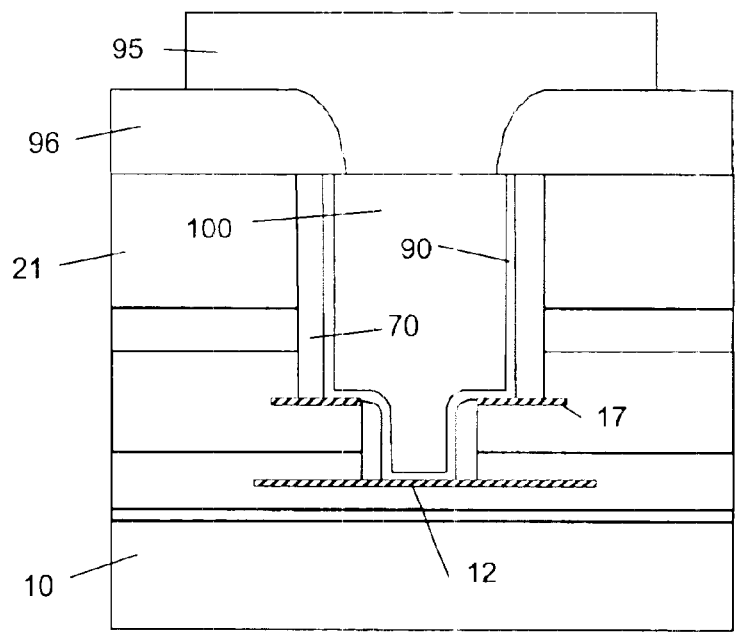
FIG. 11 is a diagram illustrating metallization of the structure of FIG. 10A.

An example is shown in FIG. 11 with insulating material 96, such as a deposited or spun-on oxide or polymer, formed on the die 14–16 after CMP, and interconnect routing or underbump metallization 95 formed on material 96 in contact with metal structure 100. Another filler material may be used, as shown in FIG. 3B, prior to forming material 96. Metallization may include several levels, separated by insulating layers, not shown here, to accommodate a high via density and/or a high degree of routing complexity. Alternatively, if the polishing step does not remove conformal dielectric film 30, conformal dielectric film remains and may provide adequate electrical isolation for the metallization structures.

Figure 12:
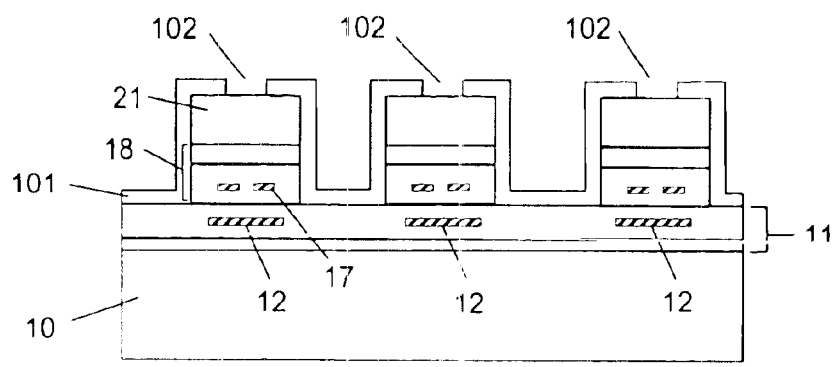
FIG. 12 is a diagram of a second embodiment using a mask layer without an intervening dielectric layer.
Figure 13:
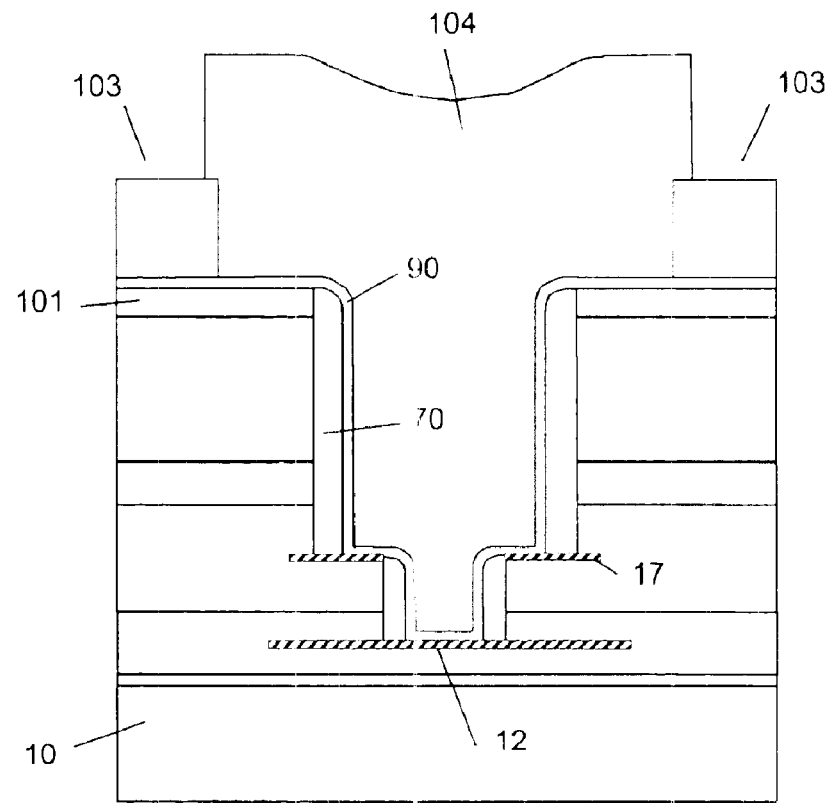
FIG. 13 is a diagram showing forming a metal contact in the second embodiment.
Figure 14:
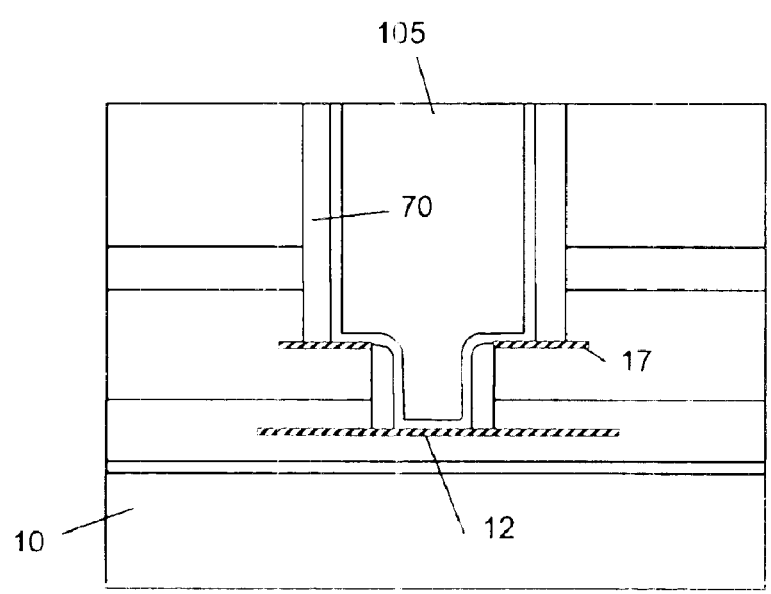
FIG. 14 is a diagram showing the structure of FIG. 13 after chemo-mechanical polishing.

A second embodiment of the method according to the invention is illustrated in FIG. 12. A hard mask 101 is formed on die 14–16 without any intervening dielectric layer. The hard mask 101 is preferably comprised of a material that has a high etch selectivity to a subsequent etch process or processes used to etch a via through thinned substrate 21 and device regions 18 and 11 to contact structures 12 An example of a hard mask is aluminum, tungsten, platinum, nickel, or molybdenum and an example of an etch process is an SF6-based reactive ion etch to etch a via through a thinned silicon substrate and a CF4-based reactive ion etch to etch a subsequent via through device regions 18 and 11 to contact structures 12. Apertures 102 are formed in mask 101 and the structure is processed as in the first embodiment to etch through the die substrates and device regions to expose structures 12 and 17, while preferably exposing the top surface of structures 17 to form a ledge (such as 80 shown in FIGS. 8A and 8B). Metallization is carried out as shown in FIGS. 7–9 using mask 103 to form metal contact 104, to produce the structure shown in FIG. 13. After CMP (FIG. 14), the structure is suitable for subsequent processing including but not limited to photolithography-based interconnect routing or underbump metallization to support wirebonding or flip-chip packaging, such as the metallization structure shown in FIG. 11. This processing may include the formation of an electrically insulating material on the exposed side of die 14–16 to provide electrical isolation for said interconnect routing or underbump metallization that is routed over the exposed side of die 14–16. To further assist interconnect routing or underbump metallization, a planarizing material, such as a polyimide or benzocyclobutene material may be formed to planarize the surface of the structure, for example by filling any spaces between die, apertures or grooves, either before or after the CMP process.

Figure 15:
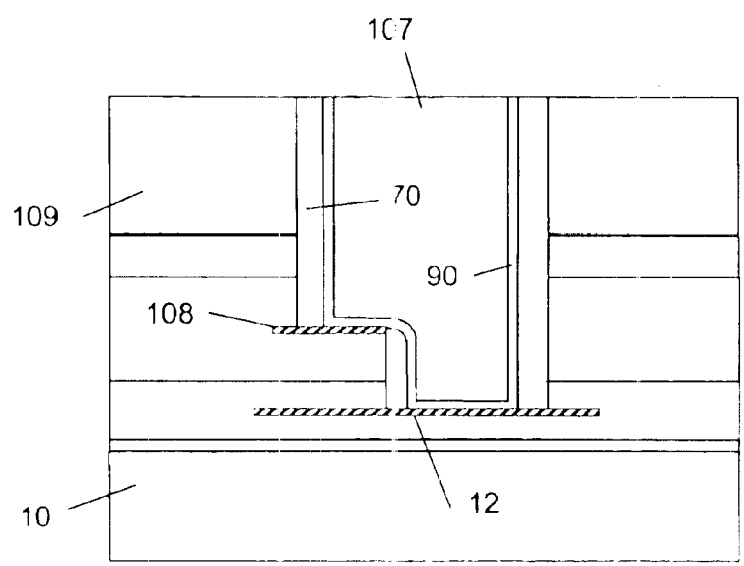
FIG. 15 is a diagram illustrating another embodiment of the invention.

The present invention may also be used with other structures. For example, a pair of contacts 17 is not required but a single contact in a die or wafer may be connected to a contact in the substrate to which it is bonded. This is illustrated in FIG. 15 where metal contact 107 interconnects contact structures 12 and 108 with structure 108 being offset from structure 12. A first edge portion of the mask is formed over structure 108 while a second edge portion is formed over structure 12 but not over structure 108. One part (left side) of contact 107 extends from the upper surface of substrate portion 109 directly to structure 108 while another part (right side) of contact 107 extends from the upper surface of substrate portion 109 directly to structure 12.

The present invention provides numerous advantages. A single mask is used to etch through the backside of a die or wafer bonded to a substrate to interconnect the die or wafer and the substrate. No photolithography is needed in the via, which typically can be complicated, problematic, and limit scaling. The etching proceeds through a bonding interface. Further, it is possible to expose top surfaces of the contacts to be interconnected, increasing the surface area of the contact and reducing the resistance of the contact. Different technology devices can be interconnected, optimizing device performance and avoiding the problems associated with trying to manufacture different technologies with a single process sequence.

Figure 16A:
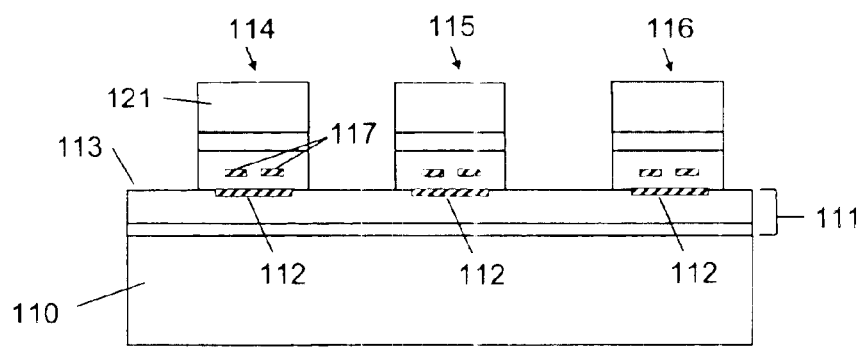
FIG. 16A is a diagram illustrating an embodiment where a contact structure is located in the surface of one of the devices.
Figure 16B:
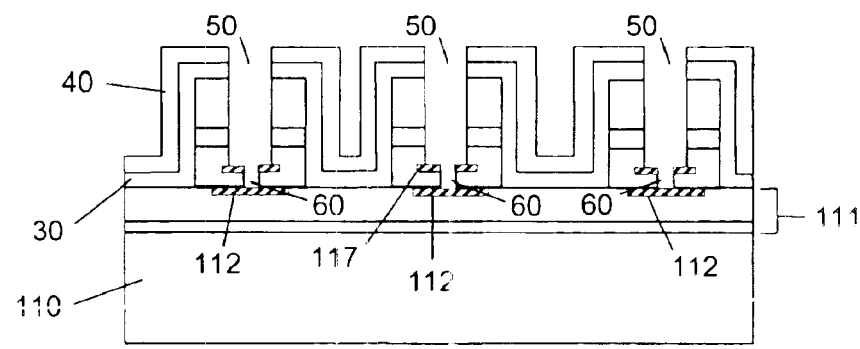
FIG. 16B is a diagram of the structure of FIG. 16A after further processing.
Figure 17:
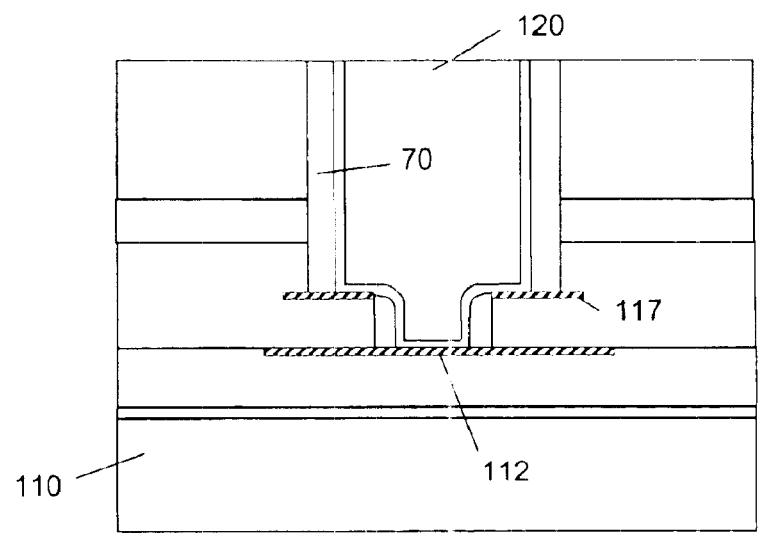
FIG. 17 is a diagram showing a device produced using the method according to the invention with the structure shown in FIGS. 16A and 16B.

A further embodiment is shown in FIGS. 16A, 16B and 17. Substrate 110 has device region 111 with contact structures 112. Die 114–116 each having a substrate portion 121 and contacts 117 are bonded to substrate 110 on surface 113 as shown in FIG. 16A. In this embodiment there is no material covering contact structures 112. Following the single masking process described for the first or second embodiments, the structures shown in FIGS. 16B and 17 is produced. A via 50 is etched through substrate 118, exposing a planar (back) surface of contact structures 117. The etching is continued to expose a top surface of contact structure 112. Contact 120 is formed in the via, with or without a seed layer 90, connecting contact structures 112 and 117. Filler material may be used to planarize the device, as discussed above with respect to FIG. 3B.

Figure 18:
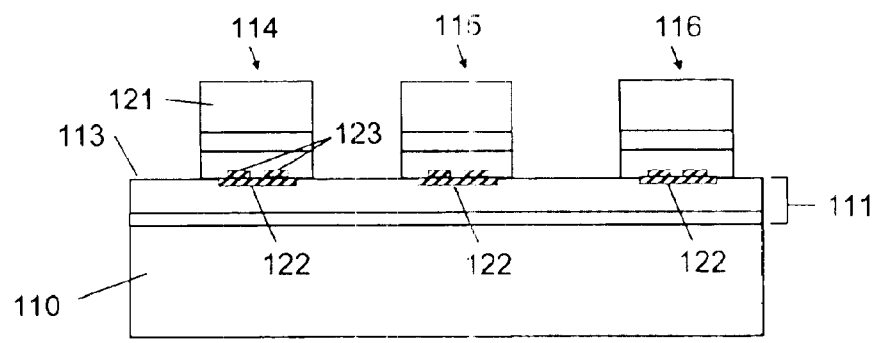
FIG. 18 is a diagram of another embodiment of the invention.
Figure 19:
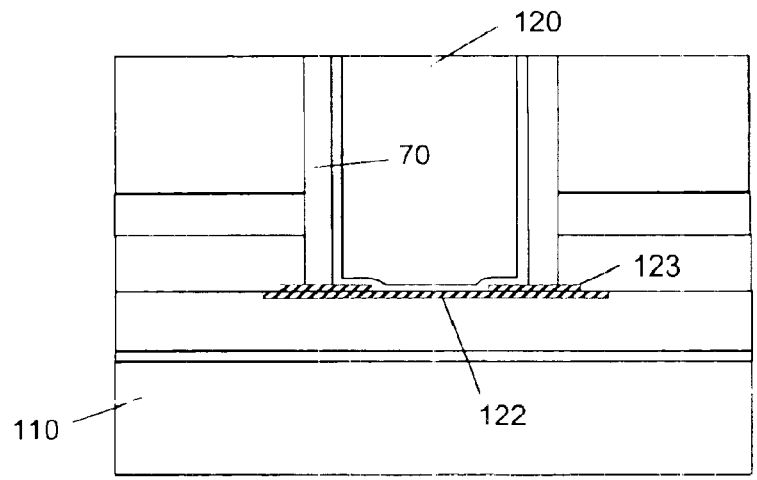
FIG. 19 is a diagram showing a device produced using the method according to the invention with the structure shown in FIG. 18.

A still further embodiment is shown in FIGS. 18–19. In this embodiment there is no material covering contact structures 122 or 123. Contact structures 123 in die 114–116 may extend beyond the surfaces of die 114–116 and contact structures 122 may extend beyond surface 113. Die 114–116 with exposed metal are bonded to surface 113 with exposed metal, as described in application Ser. No. 10/359,608. The bond between die 114–116 and substrate 110 elastically produces a compressive force between contact structures 122 and 123, creating a contact between structures 122 and 123 sufficiently low in contact resistance. Following the single masking process described for the preceding embodiments, the structure shown in FIG. 19 is produced.

Numerous modifications and variations of the present invention are possible in light of the above teachings. It is therefore to be understood that within the scope of the appended claims, the invention may be practiced otherwise than as specifically described herein.

What is claimed is:

1. A method of interconnecting first and second elements bonded together, comprising:
   forming one mask over an exposed side of said first element;
   using said one mask to etch said first element and expose a first contact structure in said first element, etch through a bond interface between said first and second elements, and expose a second contact structure in said second element; and
   connecting said first and second contact structures.

2. A method as recited in claim 1, wherein exposing said first contact structure comprises:
   exposing a planar surface of said first contact structure; and
   connecting said planar surface to said second contact structure.

3. A method as recited in claim 2, comprising:
   exposing a side surface of first contact structure.

4. A method as recited in claim 2, comprising:
   forming said first contact structure to have an aperture; and
   etching through said aperture to expose said second contact structure.

5. A method as recited in claim 2, comprising:
   forming said first contact structure as at least a pair of contact elements with a space between said contact elements; and
   etching through said space to expose said second contact structure.

6. A method as recited in claim 1, comprising:
   forming said first contact structure to have an aperture; and
   etching through said aperture to expose said second contact structure.

7. A method as recited in claim 1, comprising:
   forming said first contact structure as at least a pair of contact structures with a space between said contact structures; and
   etching through said space to expose said second contact structure.

8. A method as recited in claim 1,
   removing at least a portion of a substrate of said first element after bonding; and
   performing said etching step after said removing step.

9. A method as recited in claim 1, wherein a plurality of first elements are bonded to said second element, said method comprising:
   forming said one mask over an exposed side of each of said first elements;
   using said one mask to etch each of said first elements to expose a first contact structure in each of said first elements, etch through a bond interface between each of said first elements and said second element, and expose a plurality of second contact structures in said second element; and
   connecting said first and second contact structures.

10. A method as recited in claim 9, comprising:
    removing at least a portion of a substrate of each of said first elements after bonding; and
    performing said etching step after said removing step.

11. A method as recited in claim 1, wherein said connecting step comprises:
    forming a metal seed layer in contact with said first and second contact structures; and
    forming a metal contact on said metal seed layer.

12. A method as recited in claim 11, comprising:
    chemo-mechanically polishing said metal contact and said first element after forming said metal contact.

13. A method as recited in claim 1, comprising:
    forming a dielectric layer on said first element;
    forming said mask on said dielectric layer.

14. A method as recited in claim 1, comprising:
    forming said mask directly on said exposed side of said first element.

15. A method as recited in claim 1, comprising:
    forming said mask over a backside of said first element;
    exposing a back surface of said first contact structure; and
    exposing a top surface of said second contact structure.

16. A method as recited in claim 1, comprising:
    forming a via in said first element during said etching step;
    forming a dielectric layer on sidewalls of said via; and
    etching said dielectric layer to expose said first and second contact structures.

17. A method as recited in claim 16, comprising:
    forming a metal seed layer over said dielectric layer and in contact with said first and second contact structures; and
    forming a metal contact on said metal seed layer.

18. A method as recited in claim 1, comprising:
forming a first via in said first element using said mask; and
forming a second via in said second element using said first contact structure.

19. A method as recited in claim 1, wherein said first element comprises a first device having said first contact structure and said second element comprises a second device having said second contact structure.

20. A method as recited in claim 1, wherein said first element comprises a first device having said first contact structure and said second element comprises a module having a plurality of connection structures including said second contact structure.

21. A method as recited in claim 1, comprising:
forming said mask to have an edge portion formed over said first contact structure and a second edge portion formed over said second contact structure and not over said first contact structure.

22. A method as recited in claim 1, comprising:
bonding said first element to said second element such that said first contact structure directly contacts said second contact structure.

23. A method as recited in claim 1, wherein a plurality of first elements are bonded to said second element, said method comprising:
forming said one mask over an exposed side of each of said first elements;
using said one mask to etch each of said first elements to expose a first contact structure in each of said first elements, etch through a bond interface between each of said first elements and said second element, and expose a plurality of second contact structures in said second element; and
connecting said first and second contact structures.

24. A method as recited in claim 23, comprising:
connecting a plurality of first contact structures to a respective plurality of second contact structures.

25. A method as recited in claim 1, comprising:
stopping said etch after exposing said first contact structure;
forming a mask material on said first contact structure; and
resuming said etch after said forming step to expose said second contact structure.

26. A method as recited in claim 25, wherein said forming step comprises electroless plating said first contact structure with a metal material.

27. A method of connecting a first device having a first substrate portion to an element, said first device bonded to said element such that said substrate portion of said first device is exposed, comprising:
forming a first mask over said substrate portion;
etching said first device using said first mask to expose a first contact structure in said first device; and
etching using said first contact structure as a second mask to expose a second contact structure in said element; and
connecting said first and second contact structures.

28. A method as recited in claim 27, wherein exposing said first contact structure comprises:
exposing a planar surface of said first contact structure; and
connecting said planar surface to said second contact structure.

29. A method as recited in claim 28, comprising:
exposing a side surface of first contact structure.

30. A method as recited in claim 28, comprising:
forming said first contact structure to have an aperture; and
etching through said aperture to expose said second contact structure.

31. A method as recited in claim 28, comprising:
forming said first contact structure as at least a pair of contact elements with a space between said contact elements; and
etching through said space to expose said second contact structure.

32. A method as recited in claim 27, comprising:
forming said first contact structure to have an aperture; and
etching through said aperture to expose said second contact structure.

33. A method as recited in claim 27, comprising:
forming said first contact structure as at least a pair of contact structures with a space between said contact structures; and
etching through said space to expose said second contact structure.

34. A method as recited in claim 27, comprising:
removing at least a portion of a substrate of said first device after bonding; and
performing said etching step after said removing step.

35. A method as recited in claim 27, wherein a plurality of first devices are bonded to said element, said method comprising:
forming said one mask over an exposed side of each of said first devices;
using said one mask to etch each of said first elements to expose a first contact structure in each of said first elements, etch through a bond interface between each of said first elements and said element, and expose a plurality of second contact structures in said element; and
connecting said first and second contact structures.

36. A method as recited in claim 35, comprising:
removing at least a portion of a substrate of each of said first elements after bonding; and
performing said etching step after said removing step.

37. A method as recited in claim 35, comprising:
connecting a plurality of first contact structures to a respective plurality of second contact structures.

38. A method as recited in claim 27, wherein said connecting step comprises:
forming a metal seed layer in contact with said first and second contact structures; and
forming a metal contact on said metal seed layer.

39. A method as recited in claim 27, comprising:
chemo-mechanically polishing said first device after forming said metal contact.

40. A method as recited in claim 27, comprising:
forming a dielectric layer on said first device;
forming said mask on said dielectric layer.

41. A method as recited in claim 27, comprising:
forming said mask over a backside of said first device;
exposing a back surface of said first contact structure; and
exposing a top surface of said second contact structure.

42. A method as recited in claim 27, comprising:
forming a via in said first device during said etching step;
forming a dielectric layer on sidewalls of said via; and
etching said dielectric layer to expose said first and second contact structures.

43. A method as recited in claim 42, comprising:
forming a metal seed layer over said dielectric layer and in contact with said first and second contact structures; and
forming a metal contact on said metal seed layer.

44. A method as recited in claim 27, comprising:
forming a first via in said first device using said mask; and
forming a second via in said element using said first contact structure.

45. A method as recited in claim 27, wherein said element comprises a module having a plurality of connection structures including said second contact structure.

46. A method as recited in claim 27, comprising:
bonding said first device to said element such that said first contact structure directly contacts said second contact structure.

47. A method as recited in claim 27, comprising:
after etching said first device to expose said first contact structure;
forming a mask material on said first contact structure; and
etching using said first contact structure as a second mask to expose a second contact structure in said element after said step of forming a mask material.

48. A method as recited in claim 47, wherein said step of forming a mask material comprises electroless plating said first contact structure with a metal material.

* * * * *